(12) United States Patent
Kolsrud et al.

(10) Patent No.: US 6,317,071 B1
(45) Date of Patent: Nov. 13, 2001

(54) METHOD AND APPARATUS FOR ANALOG-TO-DIGITAL CONVERSION BY COMBINING DIGITAL SAMPLE VALUES

(75) Inventors: Arild Kolsrud, Bridgewater; Hui Wu, Union, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/643,637

(22) Filed: Aug. 22, 2000

(51) Int. Cl.$^7$ ........................................ H03M 1/12
(52) U.S. Cl. ........................ 341/155; 341/115; 341/120
(58) Field of Search .................... 341/131, 155, 341/118, 115, 120, 116, 157, 156, 122, 110, 126; 375/243; 371/3

(56) References Cited

U.S. PATENT DOCUMENTS

| | | | |
|---|---|---|---|
| 4,903,023 | * | 2/1990 | Evans et al. .......................... 341/120 |
| 5,563,596 | * | 10/1996 | Snyder et al. ........................ 341/131 |
| 5,610,943 | * | 3/1997 | Kakuishi et al. ..................... 375/243 |
| 5,714,956 | * | 2/1998 | Jahne et al. .......................... 341/155 |
| 5,774,470 | * | 6/1998 | Nishiya et al. .......................... 371/3 |
| 5,825,318 | * | 10/1998 | Patapoutian et al. ................ 341/131 |

* cited by examiner

*Primary Examiner*—Brian Young
*Assistant Examiner*—John B Nguyen
(74) *Attorney, Agent, or Firm*—Alston & Bird LLP (57) ABSTRACT

An analog-to-digital (A/D) converter system converts an analog input signal into a digital output value by combining a plurality of digital sample values. For example, an A/D converter converts an RF analog signal into digital sample values. The A/D system comprises averaging circuitry which takes the average of N digital sample values from the A/D converter. The average is produced as the digital output value for digital processing circuitry. The signal to noise ratio (SNR) of the A/D system is thereby increased because in the averaging process noise components tend to cancel due to their random nature. The increase in the SNR provided by averaging the digital sample values enables the use of higher sampling rates because the processing gain achieved by averaging the digital signal samples counters the degradation caused by clock jitter. As such, a higher speed A/D converter can be used to directly convert an RF analog signal, thereby reducing the need for frequency conversion stages. In certain embodiments, the data rate or speed is reduced to produce digital output values at a data rate compatible with the digital processing circuitry.

21 Claims, 8 Drawing Sheets

SIGNAL TO NOISE RATIO (SNR) AS A FUNCTION OF ADC ANALOG INFORMATION INPUT FREQUENCY.

| OUTPUT FROM ADC | OUTPUT FROM COMBINING CIRCUIT |
|---|---|
| 1 | - |
| 2 | - |
| 3 | - |
| 4 | - |
| 5 | 1+2+3+4 |
| 6 | 2+3+4+5 |
| 7 | 3+4+5+6 |
| 8 | 4+5+6+7 |
| 9 | 5+6+7+8 |
| .. | .... |
| .. | .... |

METHOD AND APPARATUS FOR ANALOG-TO-DIGITAL CONVERSION BY COMBINING DIGITAL SAMPLE VALUES

BACKGROUND OF THE INVENTION

1. Field of the Invention

This invention relates to analog-to-digital converters and, more particularly, to an analog-to-digital converter system which combines a plurality of digital sample values to produce a digital output value.

2. Description of Related Art

Many physical devices generate output signals which are analog or continuously varying. Today, signal processing is often accomplished using digital methods. In many applications it is required to convert an analog signal into a digital form suitable for processing by a digital system. Many types of converters exist which act as interfaces between analog devices and digital systems. These converters are used in a variety of applications, including testing, measurement, process control, and communications. In converting analog signals to digital form, the analog signal is typically sampled and quantized. In a typical wireless communications system, a radio frequency (RF) signal comprised of information signals(s) modulated onto RF carrier(s) is received by an antenna. For example, for cellular communications in the United States, information signals are carried over frequency channels within 824–849 MHz and 869–894 MHz. In a Personal Communications System (PCS), information signals are carried over frequency channels on one or more PCS bands 1850 MHz–1910 MHz and 1930–1990 MHz. After some filtering and frequency down-conversion to an intermediate frequency (IF), the analog signals are provided to a low noise amplifier (LNA). The LNA amplifies the analog signals and provides the analog signals to an A/D converter for analog to digital conversion. The A/D converter provides the digital values to a bus which provides the digitized signals to the digital radio circuitry, for example digital downconverters connected to associated digital signal processors.

Today, a fast A/D converter can run at speeds of up to 1 Gigasamples per second (GSps). At the faster speeds, the signal to noise ratio (SNR) of the digital signal from the A/D converter can degrade when the A/D converter clock has imperfections, such as clock jitter. In any event, digital downconverters can only handle maximum data speeds at its input of up to 70 Megasamples per second (MSps). Frequency conversion stages can be used to frequency convert the analog signals to lower IF frequencies, but these add noise and cost. Furthermore, the data rate at the input to the digital downconverters can be reduced by discarding a subset of the digital sample values. However, such schemes fail to take advantage of the higher sampling speed of the A/D converter and introduce noise to the digital signal.

Accordingly, a need exists for analog to digital conversion at higher speeds where effects, such as clock jitter, are reduced and the higher speed sampling of the A/D converter can be taken advantage of in the lower speed digital signal processing circuitry, such as the digital downconverters.

SUMMARY OF THE INVENTION

The present invention is an analog-to-digital (A/D) converter system which converts an analog input signal into a digital output value by combining a plurality of digital sample values. For example, an A/D converter converts an RF analog signal into digital sample values. The A/D system comprises averaging circuitry which takes the average of N digital sample values from the A/D converter. The average is produced as the digital output value for digital processing circuitry. The signal to noise ratio (SNR) of the A/D system is thereby increased because in the averaging process noise components tend to cancel due to their random nature. The increase in the SNR provided by averaging the digital sample values enables the use of higher sampling rates because the processing gain achieved by averaging the digital signal samples counters the degradation caused by clock jitter. As such, a higher speed A/D converter can be used to directly convert an RF analog signal, thereby reducing the need for frequency conversion stages. In certain embodiments, the data rate or speed is reduced to produce digital output values at a data rate compatible with the digital processing circuitry.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
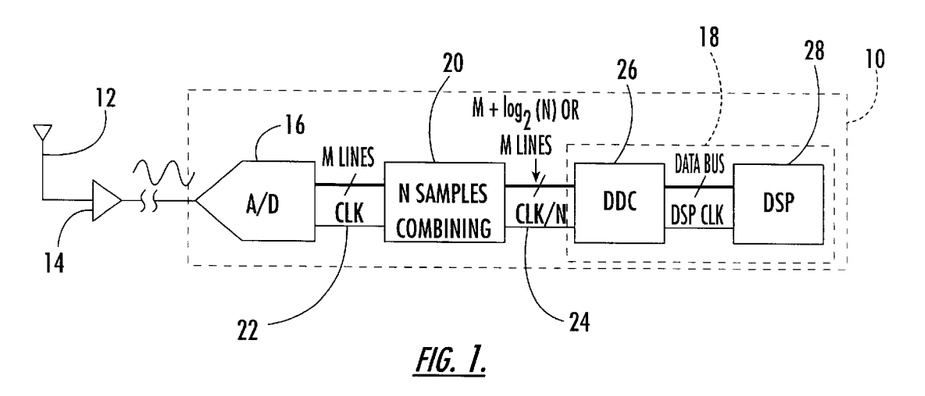
FIG. 1 shows a general block diagram of an embodiment of the A/D system according to principles of the present invention.

Illustrative embodiments are described below of an analog to digital (A/D) converter system which uses a high speed A/D converter to digitally convert an analog signal into digital sample values which are combined to produce the digital output value for lower speed digital processing circuitry. Rather than discard digital sample values to reduce the data rate, digital sample values are combined to produce a digital output value, thereby reducing the data rate while retaining information from a plurality of digital sample values in the digital output value. For example, FIG. 1 shows a digital receiver 10 which could be used to directly receive radio frequency (RF) signals from an antenna 12 and analog receive circuitry 14, such as a low noise amplifier. As such, the digital receiver 10 includes a high speed analog to digital (A/D) converter 16 which runs at high sampling speeds, for example at 1 GHz. Because digital processing circuitry typically only can handle data speeds at its input of up to 70 MHz, a combining circuit 20 combines digital sample values from the A/D converter 16 to produce digital output values to the digital processing circuitry 18 at a reduced rate. More data is retained because the digital sample values are combined to produce the digital output values. Alternative embodiments can include frequency conversion stage(s) or other circuitry (not shown) to reduce the frequency of the RF analog signals, thereby not requiring as high a speed from the A/D converter 16.

In certain embodiments, the A/D converter 16 is a high speed A/D converter which is capable of directly sampling the RF analog signal from the antenna 12 and producing M-bit digital sample values to the combining circuit 20. The combining circuitry 20 can be an averaging circuit which takes N successive M bit data words from the A/D converter 16, averages them and sends the result as the digital output value to the digital processing circuitry 18. The data speed reduction is N times. As shown, a clock signal 22 (CLK) is used from the A/D 16 to the combining circuit 20, and the clock signal 24 (CLK/N) from the combining circuit 20 to the digital processing circuitry 18 is shown as a multiple N of the clock signal 22.

For high accuracy, the number of data bits in the digital output value or the number of lines from the combining circuit 20 to the digital processing circuitry 18 can be more than the M bits plus decimal bits. For example, if the combining circuit 20 sums the N, M bit digital sample values as the digital output value, the digital output value can total $X=M+\log 2(N)$ bits if the digital processing circuitry 18 can handle the X bits, thereby increasing the resolution. In this embodiment, the digital processing circuitry 18 includes a digital downconverter (DDC) 26 and a digital signal processor (DSP) 28. Usually, the DDC 22 can handle more bits than the resolution of the A/D 16, and by using all the bits from the combining circuit 20 (hence not taking the average, but adding bits to increase the resolution), higher processing gain can be achieved.

As mentioned above, in this embodiment, the combining circuit 20 serves as data speed reduction circuitry which is comparable to using a slower A/D. For example, if a 65 Msps A/D is used to digitize the analog signal, the conversion would require a time delay of $1/65*10^6 = 15.4$ nsec. If the A/D is run at eight times the speed of the DDC 26 or 520 Msps a total number of 10 clock cycles can be used to convert add and take the average of eight samples before submitting them to the DDC 26 at a rate of 65 MHz. The total time needed for the operation would be $10*1/520*10^6 = 19.23$ nsec. As such, a higher speed A/D can replace a lower speed A/D and the frequency down-conversion stages required by the lower speed A/D. When sampling at higher speeds, the noise introduced by clock jitter can be offset by the processing gain achieved through an increase in sampling resolution resulting from combining digital sample values in producing the digital output value.

Figure 2:
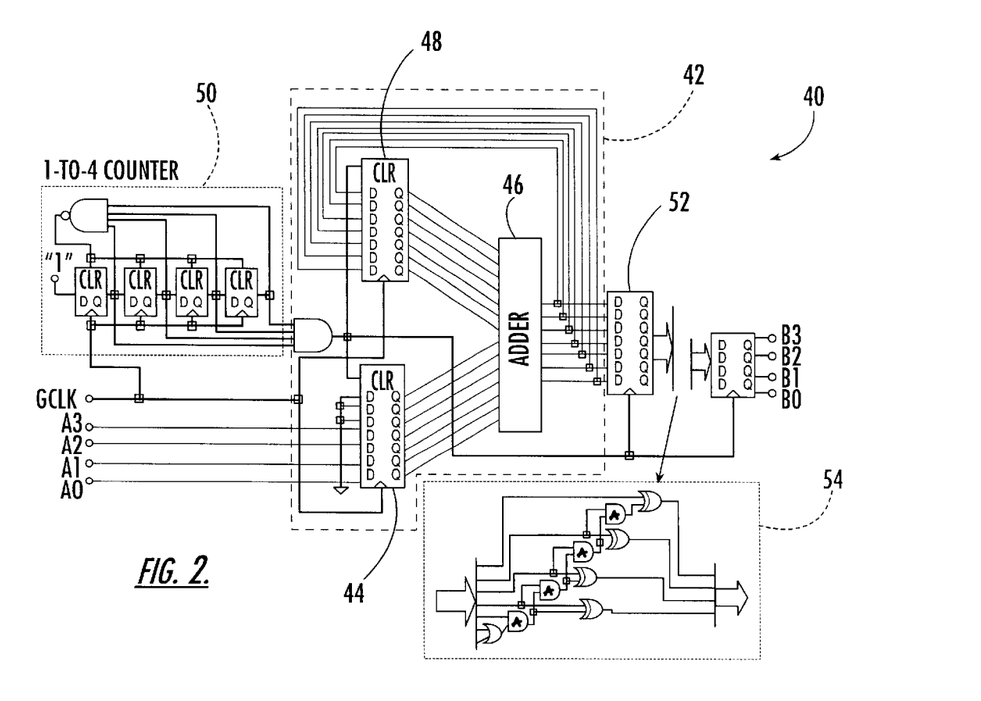
FIG. 2 shows a detailed block diagram for an embodiment of the A/D system according to the principles of the present invention.

FIG. 2 shows an example implementation of a combining circuit 40 which takes the real time average of four 4-bit words or digital sample values (A0–A3) from an A/D converter to produce a 4 bit digital output value (B0–B3). In this implementation, an adding circuitry 42 receives a 4 bit digital sample value (A0–A3) which is clocked into the 4 least significant bits of a 7 gate D flip-flop 44 by a clock (GCLK). An adder 46 adds the output of the D flip-flop 44 and the output of a 7 gate D flip-flop 48 which stores the running total at the output of the adder 46 for the four sample summing cycle. During the next clock cycle, the output of the adder 46 is stored in the D flip-flop 48 and added by the adder 46 to the next digital sample value clocked into the D flip-flop 44. Using a 1 to 4 counter 50, the adder 46 produces the sum of four successive digital sample values. After the fourth digital sample value is clocked into the D flip-flop 44 and summed to the running total in the D flip-flop 48, the sum of the four digital sample values is provided to a 7 gate D flip-flop 52, and the contents of the flip flops 44 and 48 are cleared.

In this embodiment, an averaging stage 54 receives the sum of the four digital sample values and takes the average of the summed signals. In this embodiment, the averaging stage 54 uses the four most significant bits (MSB) of the sum from the D flip-flop 52 and adds a "1" if the fraction is above 0.5 or ignoring the fraction if it is less than 0.5. This averaging and rounding technique will increase the noise floor and should not be performed if very high spurious dynamic range is needed or if high signal-to-noise ratio (SNR) is required. Usually, the digital downconverters (DDC) can handle more bits, for example 16–18 bits, than the resolution of the A/D converter, and by using all the bits from the D flip flop 52 (hence not taking the average, but adding bits by increasing the resolution), higher SNR can be achieved.

Figure 3:
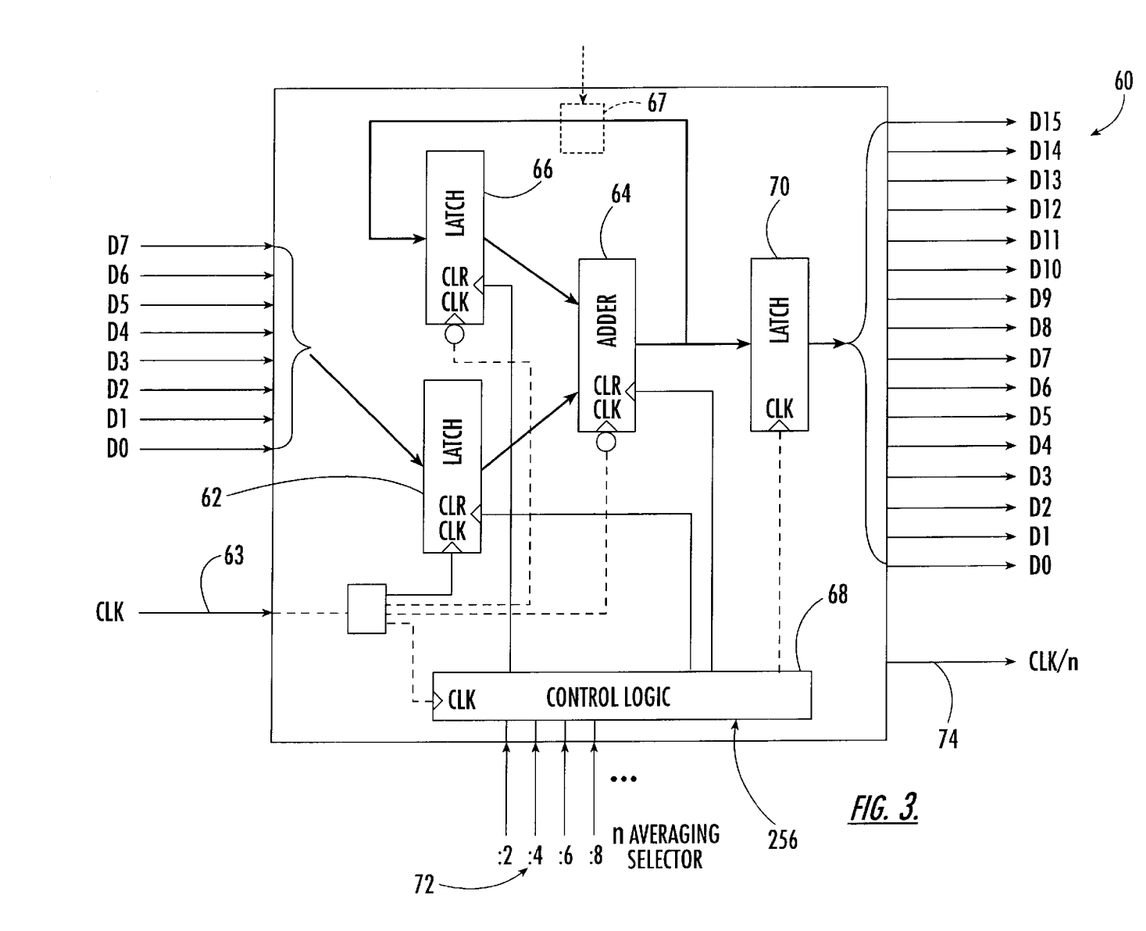
FIG. 3 shows a general block diagram of an alternative embodiment of the A/D system according to principles of the present invention.

FIG. 3 shows an example implementation of a combining circuit 60 which takes the real time average of N 8-bit words or digital sample values (D0–D7) from an A/D converter to produce a 16 bit digital output value (D0–D15) and a clock signal (CLK/N) dependent on the number N of digital sample values being combined to form the digital output value. By changing the number of digital sample values being combined to form the digital output value, the data rate at which the digital output value are produced from the A/D converter can be varied periodically or dynamically as well as the bit resolution of the A/D system. In this implementation, an 8 bit digital sample value and a clock signal synchronized with the A/D converter is received by the combining circuit 60. The digital sample value is clocked into a latch 62 using a clock signal 63, so the digital sample value appears at the output of the latch 62 and provided to an adder 64. The adder 64 adds the output of the latch 62 and the output of a latch 66 which stores the running total (zero when the first of the N digital sample values being combined is received) of the combined sample values. After adding the output of the latches 62 and 66, the output of the adder 64 is stored in the latch 66 and added by the adder 64 to the next digital sample value clocked into the latch 62. A function block 67 can be used to implement a weighting function on the digital sample values, for example by adding a weighting offset or multiplying by a weighting factor to the digital sample value(s), for example to adjust the digital sample value by taking into account the changing sample position on the analog signal caused by a phase difference between the sampling frequency and the analog signal center frequency. Control circuitry 68 can be synchronized by the clock 63 and can count the number of samples being clocked in to the latch 62 and added together by the adder 64, and after summing N digital sample values, the output of the adder 64 can be clocked into a latch 70 by the control circuitry 68, and the control circuitry 68 can send control signals to clear the contents of the latches 62 and 66 and the adder 64.

In response to control signals 72, the control circuitry 68 can change the number N of digital sample values summed together to produce the digital output value. In this embodiment, the number of digital sample values being combined is shown as being selectable from 2 to 256. The data rate slows by N times as shown by the clock signal 74 (CLK/N) which is synchronized with the production of the combined sample value. The average of the digital sample values can be obtained by dividing the combined sample value with the number N of samples to produce the digital output value. If the average is not being taken of the combined sample value and simply the sum or the combined sample value is being produced as the digital output value, the digital output value can be X bits where X=8+log 2(N). As such, the data rate of the A/D converter can be reduced by varying amounts to match the data rate of digital processing circuitry while improving on the resolution of the A/D converter.

The operation of the combining circuit can be explained by examining the summation of N digital sample values and expanding the summation term when the sampling speed is a whole integer of the center frequency of the analog signal and when the relationship is slightly offset. Consider an analog signal sampled at the instant $t_i$ $$s(t_i)=a(t_i)\cos(\omega_o t_i+\phi)+N(t_i) \quad (1)$$

where $\phi$ is the phase displacement or the position (from 0 to 359 degrees) within a full sine period where the sample is taken, and the analog signal or carrier frequency $f_0=\omega_o>>W$ (W is the bandwidth of the analog information signal a(t)) and N(t) is the noise. The summation of several terms of S(t) can be written as $$S(t) = \sum_{i=1}^{N} a(t_i)\cos(\omega i N \Delta t_s + \varphi) + \sum_{i=1}^{N} N(t_i) \quad (2)$$

where $\Delta t_s$ is determined by the sampling rate of the ADC ($\Delta t_s=1/f_s$, $f_s$ is the sampling frequency) and $t_i=i \cdot \Delta t_s$. As a requirement mentioned earlier, we would like that the ratio of $f_o/f_s$ to be close to an integer. Hence the summation of several terms of S(t) can be written as:

$$S(t) = \sum_{i=1}^{N} a(t_i)\cos(\omega_o i N \cdot \Delta t_s + \varphi) + \sum_{i=1}^{N} N(t_i). \quad (3)$$

Since for the N periods, $a(t_1)=a(t_2)=\ldots=a(t_N)$ because of $f_o/N>>W$ for a typical chosen N. After some trigonometric manipulations we get $$S(t) = a(t_1) \cdot \frac{\sin(N\pi\delta)\cos([N+1]\pi\delta)}{\sin(\pi\delta)} \cdot \cos\varphi - \quad (4)$$
$$a(t_1) \cdot \frac{\sin(N\pi\delta)\sin([N+1]\pi\delta)}{\sin(\pi\delta)} \cdot \sin\varphi + \sum_{i=1}^{N} N(t_i)$$
$$= a(t_1) \cdot \frac{\sin(N\pi\delta)}{\sin(\pi\delta)} \cdot \cos[([N+1]\pi\delta)+\varphi] + \sum_{i=1}^{N} N(t_i)$$

where N is the number of digital words to be added, and $\delta$ is given by $$\frac{f_0}{f_s} = A \pm \delta$$

where A is an integer number and $\delta<<1$. Since we are sampling at intervals which is approximately given by an integer, only the first amplitude, or $a(t_1)$ of the signal is being used (because the envelope change of the signal is changing much slower than the time it takes to sample N times). The requirement $f_o/N>>W$ is not necessary and can be relaxed to $f_o/N>W$. This adjustment will introduce some distortion to the signal a(t), but it can be corrected digitally without any difficulty and loss. Compared with Equation (1), a simple interpretation of the signal part in Equation (4) is: the averaged output shifts the phase by $(N+1)\pi\delta$.

The noise reduction or the improvement of SNR can be understood by studying an ideal case: $\delta$ is zero or the sampling frequency is a multiple integer of the carrier frequency $$\frac{f_o}{f_s} = n.$$

The summation of the samples in Equation (4) becomes $$S(t) = N \cdot a(t_1)\cos(\varphi) + \sum_{i=1}^{N} N(t_i) \quad (5)$$

The signal part adds up coherently, leading to an increase of the signal power by $N^2$, but the noise part adds up incoherently with an increase by N. Hence the SNR is enhanced by a processing gain of N. The processing gain can also be understood in the frequency domain. In principle, any low-pass digital filtering should enhance the the SNR of the signal. The N sample averaging reduces the noise level by performing a periodic low pass filtering whereby the wideband noise folds back onto itself at sampling intervals determined by the sampling process and thereby the SNR of the signal increases due to the cancellation of the noise. The processing gain decreases very slowly as $\delta$ increases. For small enough $\delta$, this conclusion remains the same as N.

Figure 4:
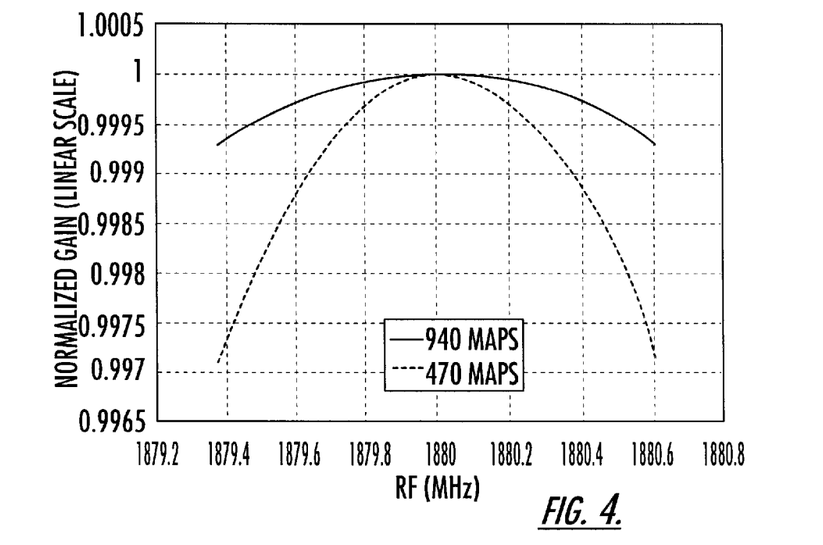
FIG. 4 is a graph showing the normalized gain realized by an A/D system which uses a sampling frequency which is a whole integer multiple of the signal frequency according to principles of the present invention.

FIG. 4 shows the normalized gain decreasing as the frequency displacement increases between a multiple of the sampling frequency and the center frequency of the analog signal. In this example, the gain is achieved by adding 15 samples of a 1.25 MHz CDMA signal at the Personal Communications Services (PCS) center frequency of 1.88 GHz band using sampling speeds of 470 Msps and 940 Msps. The percent bandwidth of the 1.25 MHz CDMA signal is 0.066% of the carrier center frequency. If 15 samples are to be added (hence reducing the data speed by 15 times and adding 4 bits of resolution (for example $\log_2(15)=3.9$) and a 11.76 dB of gain (for example, 10 $\log_{10}(15)=11.76$ dB), the gain flatness is 0.07% at 940 Msps and 0.29% at 470 Msps.

Figure 5:
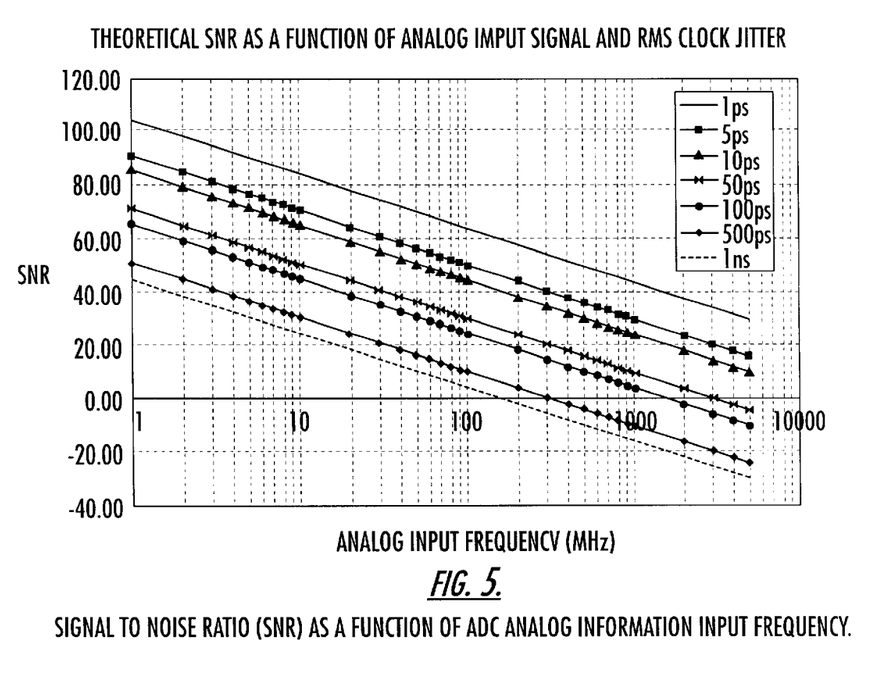
FIG. 5 is a graph showing the decrease in theoretical signal to noise ratio (SNR) due to clock jitter as a function of the analog input frequency at the input to the A/D converter.
Figure 6:
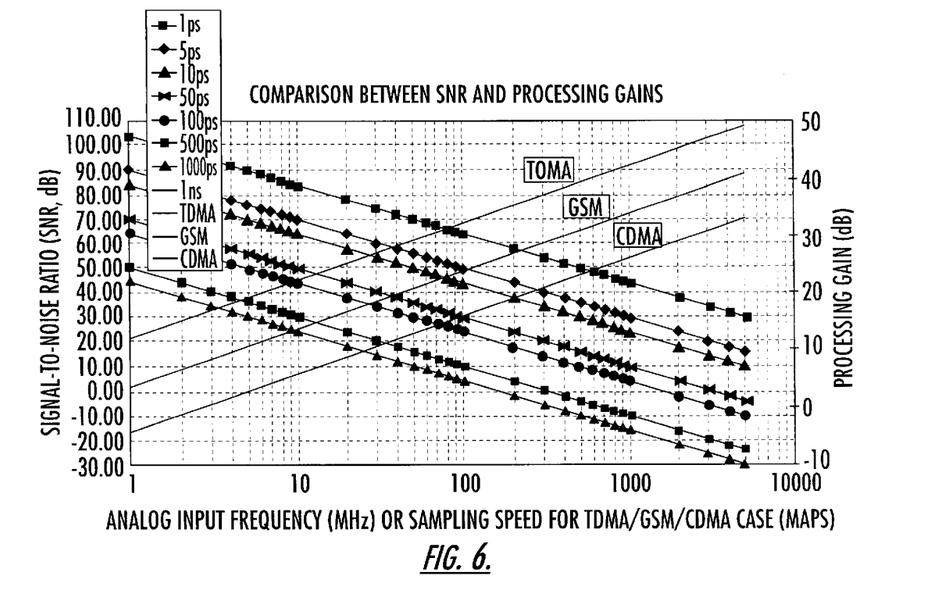
FIG. 6 is a graph showing a comparison between SNR as a function of analog input frequency and rms clock jitter and processing gain as a function of sampling frequency or speed and modulation technique (TDMA, GSM, and CDMA)

The dominant contribution to the above noise term is the clock jitter. The signal-to-noise ratio (SNR) due to clock jitter and processing gain due to over-sampling, respectively, is given as $$SNR=20 \log_{10}(2\pi f_{signal} t_j) \quad (6)$$

$$G_P = 10 \log_{10}\left(\frac{f_s}{2BW}\right) \qquad (7)$$

where $f_{signal}$ is essentially the (narrow-band) analog carrier frequency in Hertz, $t_j$ is the rms clock jitter in seconds, $f_s$ is the sampling clock frequency in Hertz, and BW is the bandwidth in Hertz of the analog information signal. It can be seen from FIG. 5 that the theoretical SNR degrades as the analog input frequency increases. Processing gain will compensate for the degradation in noise floor. The gain as a function of sampling speed is seen in FIG. 6 where the higher the sampling speed, the higher the processing gain due to increased sampling resolution.

Figure 7:
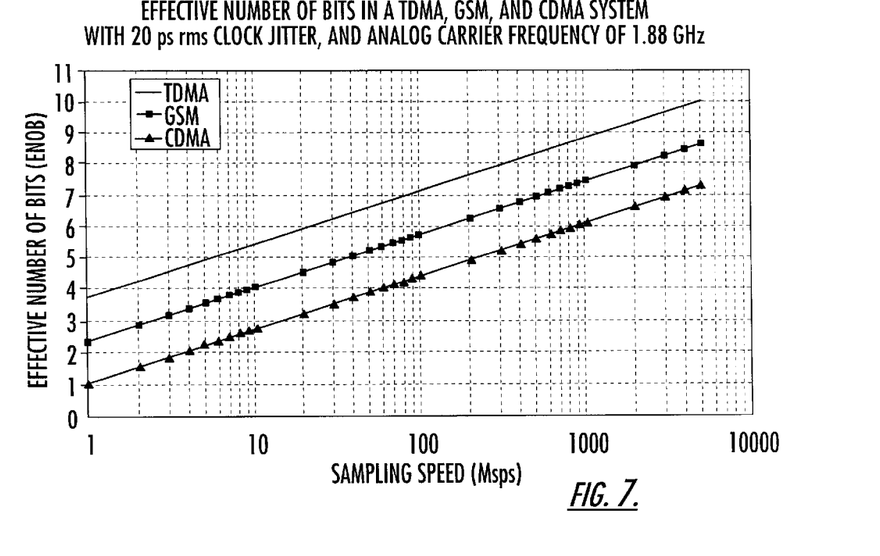
FIG. 7 is a graph showing a comparison of the effective number of bits in a TDMA, GSM and CDMA system with 20 Ps rms clock jitter and analog signal frequency of 1.88 GHz in a direct RF conversion receiver using the A/D conversion system according of the principles of the present invention.

Since clock jitter degrades the noise floor, higher sampling rates can achieve processing gain where the sampling resolution is simply increased by adding up samples in which noise components tends to cancel due to the random nature. In practice, the processing gain is limited by the speed capabilities of the digital circuitry. An example of direct RF conversion is shown in FIG. 7 which shows how the resolution is regained by increasing the sampling speed of the converter. In this example a rms clock jitter of 20 picoseconds (ps) is assumed and the analog RF center frequency is 1.88 GHz. If the signal is sampled at 600 MHz, or 600 Megasamples per second (Msps), the number of useful bits that can be used to represent the signal, which can be referred to as the effective number of bits (ENOB), for TDMA, GSM, and CDMA is 8.4 bits, 7.1 bits, and 5.7 bits, respectively. The ENOB which can be referred to as the effective bit resolution can be determined using the equation SNR=6.02 * ENOB+1.76, where SNR is the desired SNR performance for the system.

Thus, the A/D system according to the principles of the present invention provides or enables high speed conversion of higher frequency analog signals by combining digital sample values to improve the resolution while, in some embodiments, decreasing the data rate for compatibility with current digital signal processing circuitry. Accordingly, the A/D system enables direct sampling and conversion of RF analog signals using a high speed A/D converter which retains resolution by combining digital sample values to produce digital output values at a data rate which the digital processing circuitry can handle.

Depending on the design parameters, the robustness of the design, and the particular application, different components could be used or components removed from the design. In addition to the embodiment described above, alternative configurations of the A/D system according to the principles of the present invention are possible which omit and/or add components and/or use variations or portions of the described system. For example, if the processing circuitry, such as a DSP, after the high speed A/D converter can only handle a data rate of $f_sN$—a multiple of the sampling clock speed (a practical alternative for realizing circuitry), the above-described circuitry can reduce the digital data speed by summing N digital M-bit words or sample values and output the N-sum only once for each consecutive N digital sample values (N sum and dump). As such, the circuitry facilitates the interfacing with the downstream processing circuitry. In alternative embodiments, combining circuitry according to the principles of the present invention can continuously produce digital output values resulting from a variety of combinations or functions of previous sample values. Additionally, in alternative embodiments, the digital output values can be combined using a different or changing function(s) of the digital sample values which can result in different or changing data rate(s), SNR(s) and/or filter response(s).

Figure 8:
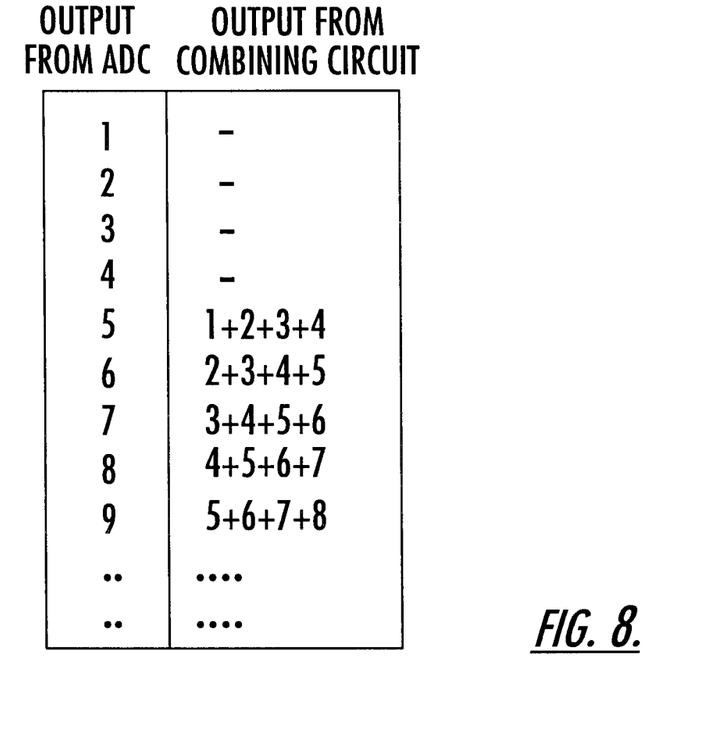
FIG. 8 shows an example of the operation of a combining circuit which provides a continuous summation of digital sample values without reducing the data rate.

FIG. 8 shows an example where the last N digital sample values or words, where N=4 in this embodiment, are continuously summed every sample cycle and produced as the digital output value with the same data speed as the input. The combining technique has the benefit of a digital filtering function and enhancement of the digital resolution without a decrease in data rate. As shown in FIG. 8, the combining circuit delays the information until the fifth sample cycle, when the digital output value is produced as the sum of the last four digital sample values. At about each subsequent sample cycle, the combining circuit produces a digital output value as the sum of the last 4 digital sample values. Thus, the continuous 4-word summation combining circuit has no digital speed reduction but has the capability of enhanced SNR, increased digital resolution and digital bandpass filtering.

Figure 9:
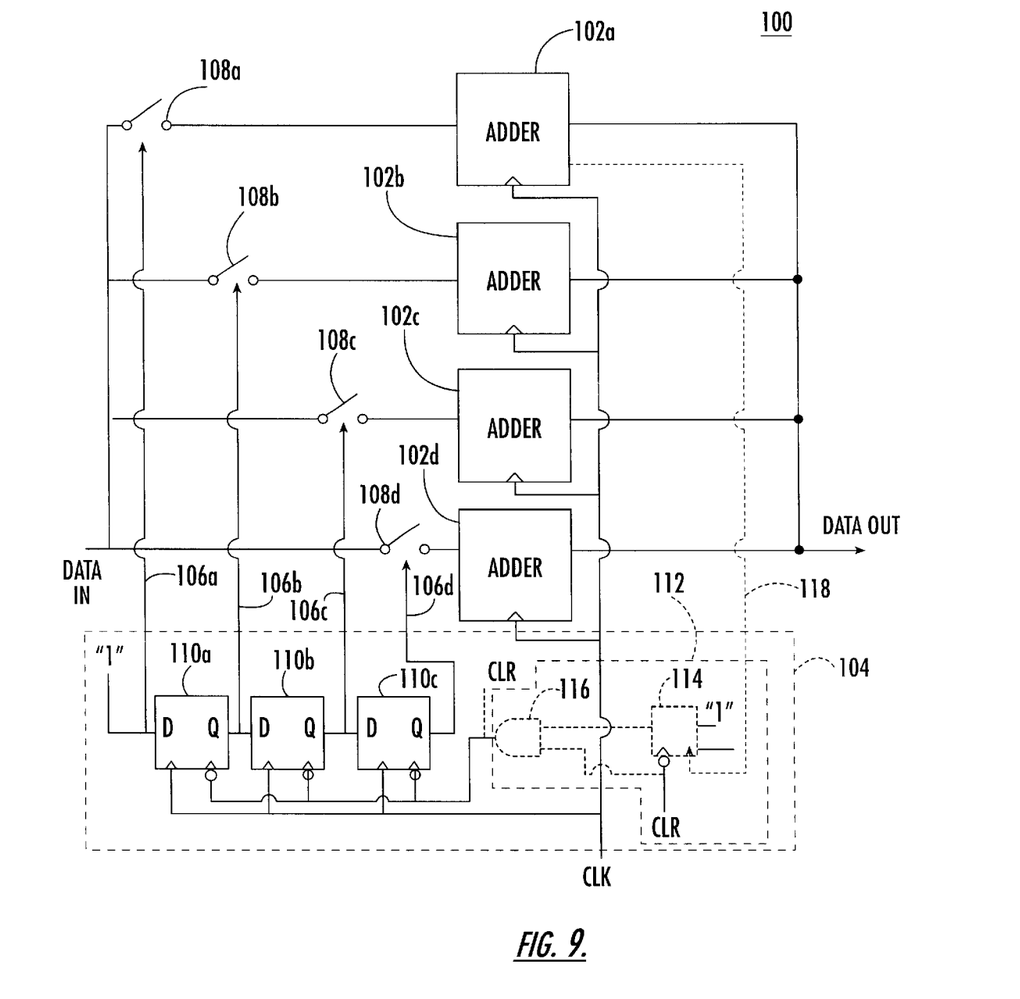
FIG. 9 shows an alternative embodiment of a combining circuit according to the principles of the present invention.

FIG. 9 shows an embodiment of a combining circuit 100 which can combine different sets of four digital sample values, for example a continuous summation of the last four digital sample values as the digital output value. In this embodiment, four combining or summing circuits 102a–d are used in the combining circuit 100. Each of the combining circuits 102a–d can be a combining circuit 40 of FIG. 2. As such, after summing four digital sample values, each summing circuit 102a–d outputs a digital output value. Depending on the desired operation, processing circuitry 104 can provide control signals 106a–d to effectively activate/deactivate the corresponding summing circuit 102a–d, for example using switches 108a–d which can be located at the input and/or output of the summing circuits 102a–d. Alternative ways to activate/deactivate the summing circuit 100 could be used. By coordinating the activating of summing circuits 102a–d, the data rate at which digital output values are produced can be changed, and different sets of digital sample values can be combined to produce a digital output value. The different sets of digital sample values combined to form digital output values can have common digital sample values, can be offset by a number of digital sample value(s), or can be disjoint.

For example, the combining circuit 100 can produce digital output values at the same data rate as the digital sample values are produced by producing a continuous summation of the last four digital sample values as described in FIG. 8. As such, the data rate remains the same but the resolution of the digital output value is improved when compared to a single digital sample value. To do so, the combining circuit 100 uses the processing circuitry 104 which includes a series of D gates 110a–c which effectively introduces a one digital sample value offset between each of the summing circuits 102a–d. In operation of this embodiment, the summing circuit 102a remains activated because the control signal 106a is set to one which keeps on the switch 108a. If a clear signal (CLR) is set high, the series of D gates 110a–c are activated for operation in a continuous summation mode, and after the first digital sample value is received by the adder 102a, the control signal 106b goes high to activate the second summing circuit 102b to receive the second digital sample value. The first summing circuit 102a also receives the second digital sample value and sums the first digital sample value and the second digital sample value. After the second digital sample value is received by the first and second summing circuits 102a–b, the third summing circuit 102c is activated to receive the third digital sample value. The first summing circuit adds the first three digital sample values, and the second summing circuit 102b adds the second and third digital sample values. After the third digital sample value is received by the third summing circuit 102c, the fourth summing circuit 102d is activated to receive the fourth digital sample value. The first summing circuit adds the first four digital sample values, the second summing circuit 102b adds the second, third and fourth digital sample values, and the third summing circuit 102c adds the third and fourth digital sample values. After summing the four digital sample values, the first summing circuit 102a outputs the sum as the digital output value.

After outputting the digital output value, the first summing circuit 102a is cleared, and the fifth digital sample value is received by the summing circuits 102a–d. The second summing circuit 102b sums the second, third, fourth and fifth digital sample values, outputs the sum as the digital output value and is cleared. The third summing circuit 102c sums the third, fourth and fifth digital sample values, and the fourth summing circuit 102d sums the fourth and fifth digital sample values. After the sixth digital sample value is received by the summing circuits 102a–d, the third summing circuit 102c sums the third, fourth fifth and sixth digital sample values, outputs the sum as the digital output value and is cleared. The fourth summing circuit 102d sums the fourth, fifth and sixth digital sample values, the first summing circuit 102a sums the fifth and sixth digital sample values, and the second summing circuit 102b retains the sixth digital sample value in its running total. After the seventh digital sample value is received by the summing circuits 102a–d, the fourth summing circuit 102d sums the fourth, fifth, sixth and seventh digital sample values, outputs the sum as the digital output value and is cleared. The first summing circuit 102a sums the fifth, sixth and seventh digital sample values. The second summing circuit 102b sums the sixth and seventh digital sample values, and the third summing circuit 102c retains the seventh digital sample value in its running total. Thus, the combining circuit 100 continuously produces a digital output value resulting from the sum of the last four digital sample values.

In this embodiment, if a reduced data rate is desired or a different combination of digital sample values, the CLR signal can be set low which sets the outputs to the D gates 110a–c low. As such, the summing circuits 102b–d are deactivated, and the summing circuit 102a remains activated to produce a digital output value after every four digital sample values are summed together to reduce the data rate by a factor of four. To initiate continuous summing mode and an increase in the data rate, additional processing circuitry 112 can be used to activate the continuous summation mode after a four sample sum cycle of the summing circuit 102a. For example, the additional processing circuitry 112 can include a latch 114. If the CLR signal is low (continuous summation mode off), the output of the latch 114 is low. An AND gate 116 receives the CLR signal and the output of the latch 114. If the output of the latch is low, the output of the AND gate 116 is low which clears the D gates 110a–c to deactivate the summing circuits 102b–d. If the CLR signal is high (continuous summation mode on), the latch 114 latches in a "1" or high signal upon an end of sum cycle signal 118 from the summing circuit 102a, for example, an output from the counter 50 of FIG. 2 indicating the end of a sample summing cycle or a CLK/n signal 74 of FIG. 3. When the output of the latch 114 goes high, the output stays high until the CLR signal goes low. When the CLR signal is high and the latch output is high, the output of the AND gate 116 is high, and the D gates are enabled to activate the summing circuits with the appropriate sample offsets.

As such, in one mode of operation for the combining circuit 100, the summing circuit 102a combines sets of four successive digital sample values and outputs a digital output value as described for the combining circuit 40 of FIG. 2 with a reduced data rate which is one-fourth the rate that digital sample values are produced. Furthermore, the combining circuit 100 can operate in a continuous summation mode where the last four digital sample values are summed at each digital sample value by one of the summing circuits 102a–d. As such, since a digital output value is produced after each digital sample value, the data rate remains the same, and the sample resolution is increased relative to a single digital sample value over the same period.

Alternative embodiments of the combining circuit 100 and the processing circuitry 104 are possible which enable different data rates and different ways of combining digital sample values. For example, two summing circuits 102a–d could be activated while two summing circuits 102a–d are deactivated to produce digital output values at half the sample rate using four sample sums offset by more than one digital sample value. For example, summing circuits 102a and c can be activated, and summing circuits 102b and d are deactivated which would produce a digital output value from the summing circuit 102a as the sum of the first four digital sample values and two sample later, the summing circuit 102c produces a digital output value as the sum of the third through sixth digital sample values. Additionally, the data rate and/or the combination scheme can be changed by changing the number of samples to be combined in producing a digital output value, the manner or function used in combining digital sample values, the overlap between digital sample values combined to make different digital output values, and/or which digital sample values are combined to form a digital sample value. For example, alternate or alternating digital sample values can be combined to form digital output values, digital sample values can be discarded, and/or digital sample values can be adjusted, for example using the relationship between the sampling frequency and the center frequency of the analog signal.

As would be understood by one of ordinary skill in the art, the various components making up the A/D system and their respective operating parameters and characteristics should be properly considered in designing the A/D system. Furthermore, the A/D system has been described using a particular configuration of distinct components, but it should be understood that the A/D system and portions thereof can be implemented in application specific integrated circuits, software-driven processing circuitry, firmware, programmable logic devices, hardware or other arrangements of discrete components as would be understood by one of ordinary skill in the art with the benefit of this disclosure. Although in the illustrative embodiment is shown with a particular circuitry, the A/D system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of converting an analog signal to a digital output, said method comprising:

converting said analog signal into digital sample values;

combining a plurality of said digital sample values to produce a digital output value; and wherein said step of combining comprises combining successive said digital sample values.

2. The method of claim 1 wherein the digital output value is a function of the sum of said plurality of digital sample values.

3. The method of claim 1 wherein said combining comprises:

summing a plurality of said digital sample values to produce said digital output value.

4. The method of claim 1 wherein said combining comprises:

averaging said plurality of said digital sample values to produce said digital output value.

5. The method of claim 1 wherein said converting comprises:

sampling said analog signal at a sampling frequency that is substantially a whole integer multiple of the signal frequency of said analog signal but offset by a small amount.

6. The method of claim 1 wherein said combining comprises:

combining N successive M bit digital sample values to produce a digital output value represented by more than M bits.

7. The method of claim 1 comprising:

receiving digital sample values at a first data rate; and outputting digital output values at a second data rate.

8. The method of claim 7 comprising:

changing said second data rate while receiving said digital sample values at said first data rate.

9. The method of claim 1 comprising:

changing the number of digital sample values combined to form said digital output value.

10. The method of claim 1 wherein said combining comprises:

using a first function to combine said plurality of digital sample values; and changing said function to form said digital output value using a second function.

11. A method of converting an analog signal to a digital output, said method comprising:

converting said analog signal into digital sample values; and combining a plurality of said digital sample values to produce a digital output value; and wherein said step of combining a plurality of said digital sample values comprises combining N successive M bit digital values to produce a digital output value of $M+\log_2(N)$ bits.

12. An analog signal to digital conversion system, comprising:

analog to digital converter receives said analog signal and converts said analog signal into digital sample values;

combining circuitry receives said plurality of digital sample values and combines said digital sample values to produce a digital output value; and wherein said digital sample values are successive values.

13. The system of claim 12 wherein said combining circuitry produces said digital output value as a function of the sum of said plurality of said digital output values.

14. The system of claim 13 wherein said combining circuitry comprises:

adding circuitry sums a plurality of said digital sample values; and averaging circuitry performs an average of said digital sample values as said digital output value.

15. The system of claim 13 wherein said combining circuitry comprising:

adding circuitry sums a plurality of said digital sample values to produce said digital output value.

16. The system of claim 12 wherein said analog to digital converter samples said analog signal at a sampling frequency that is substantially a whole integer multiple of the signal frequency of said analog signal but offset by a small amount.

17. The system of claim 12 wherein said combining circuitry combines N successive M bit digital sample values to produce a digital output value represented by more than M bits.

18. The system of claim 12 wherein said analog to digital converter outputs said digital sample values at a first data rate, and said combining circuitry outputs said digital output values at a second data rate.

19. The system of claim 18 wherein said combining circuitry changes said second data rate while receiving said digital sample values at said first data rate.

20. The system of claim 12 wherein said combining circuitry changes the number of digital sample values combined to form said digital output value.

21. An analog signal to digital conversion system, comprising:

analog to digital converter receives said analog signal and converts said analog signal into digital sample values; and combining circuitry receives said plurality of digital sample values and combines said digital sample values to produce a digital output value; and wherein said combining circuitry combines N successive M bit digital sample values to produce a digital out value of value of $M+\log_2(N)$ bits.

* * * * *